United States Patent
Tomasini et al.

(10) Patent No.: US 6,759,905 B2
(45) Date of Patent: Jul. 6, 2004

(54) ANALOG INPUT CIRCUIT WITH COMMON MODE COMPATIBILITY TO BOTH SUPPLY NODES

(75) Inventors: Luciano Tomasini, Monza (IT); Giancarlo Clerici, Vimodrone (IT)

(73) Assignee: STMicroelectronics S.r.l., Agrate Brianza (IT)

( * ) Notice: Subject to any disclaimer, the term of this patent is extended or adjusted under 35 U.S.C. 154(b) by 0 days.

(21) Appl. No.: 10/325,672

(22) Filed: Dec. 20, 2002

(65) Prior Publication Data

US 2003/0122624 A1 Jul. 3, 2003

(30) Foreign Application Priority Data

Dec. 21, 2001 (IT) ....................................... VA2001A0048

(51) Int. Cl.[7] ................................................. H03F 3/45
(52) U.S. Cl. ........................................ 330/258; 330/253
(58) Field of Search ................................ 330/258, 253, 330/69, 303

(56) References Cited

U.S. PATENT DOCUMENTS

| | | | | |
|---|---|---|---|---|
| 5,345,190 A | * | 9/1994 | Kaylor | 330/258 |
| 6,121,830 A | * | 9/2000 | Manninen et al. | 330/9 |
| 6,538,507 B2 | * | 3/2003 | Prentice et al. | 330/85 |

* cited by examiner

*Primary Examiner*—Henry Choe
(74) *Attorney, Agent, or Firm*—Lisa K. Jorgenson; Allen, Dyer, Doppelt, Milbrath & Gilchrist, P.A.

(57) ABSTRACT

An analog input circuit may include a pair of differential transconductance input stages having input nodes connected in parallel and which are fed the analog input signal. One of the differential transconductance stages may have common mode compatibility toward the supply node at the highest potential, and the other stage may have common mode compatibility toward the supply node at the lowest potential. Furthermore, differential output currents of the transconductance input stages may be summed differentially on first and second input nodes of a differential converter stage, which converts the differential current signals to an amplified differential voltage output signal.

21 Claims, 12 Drawing Sheets

ANALOG INPUT CIRCUIT WITH COMMON MODE COMPATIBILITY TO BOTH SUPPLY NODES

FIELD OF THE INVENTION

The present invention relates to the field of integrated circuits, and, more particularly, to an input circuit with common mode compatibility with respect to its supply nodes.

BACKGROUND OF THE INVENTION

In various applications relating to analog signal processing, the common mode of the input signal may vary from the positive to the negative supply voltage such as, for example, with standard low voltage differential signals (LVDS) having variable voltages from 0 to 2.4V. For these applications, the input stages of the interface circuits should be able to accept a signal with such variations without significantly degrading the performance of the amplifier.

A typical application in which the circuit of the invention may be used is illustrated in FIGS. 1A and 1B. In the illustrated example, a digital signal, transmitted on an optical fiber, is received by a first integrated circuit IC1 installed on a printed circuit board. After having been processed, the signal is sent from the first integrated circuit IC1 by a transmission block Transmit Tx through the pins and the connecting metal tracks PCB tracks to a second integrated circuit IC2. The integrated circuit IC2 is installed on the same board and receives the signal by way of an input circuit thereof which amplifies the received analog signal to make it available at an appropriate level to logic circuitry CMOS logic.

While transmission of signals through the conducting tracks of the printed circuit board is commonly done in a differential mode according to standard LVDS, the input stage of the integrated circuit IC2 that receives the signal processed by the interfacing circuit IC1 may be single ended, as shown in FIG. 1A, or may have a differential output, as shown in FIG. 1B. If the input interfacing circuit IC1 is single ended, the output signal will have a certain average value $V_{avg}$. If the output is differential, the output signal will be centered on a certain common mode voltage $V_{cm}$.

Other circuits are commonly connected in cascade to the input interfacing circuit IC1, the first of which may be an analog gain circuit G. The gain circuit G is followed by a digital buffer stage which, in practice, may even be represented by a single circuit (e.g., an inverter) having a certain threshold voltage for discriminating zeroes and ones.

It will be appreciated that, for a correct interpretation of the signals that are fed to the block G, it is important that the amplitude of the signal corresponding to a logic value 1 remains above the threshold of discrimination. Further, the amplitude of the signal corresponding to a zero logic value should also remain below the threshold of discrimination for both single ended and differential signals.

FIGS. 2A and 2B are diagrams of the signals output by the input interfacing circuit for the case of a single ended or a differential output circuit when the input signal is an analog signal corresponding to a, certain sequence of ones and zeroes. In practice, the output signal $V_{out}$ (in the case of single ended output) or $V_{out+}$ minus $V_{out-}$ (in the case of differential output) will have a shape more or less rounded and with a voltage swing (i.e., the difference between the maximum and the minimum value) typically between 250–400 mV, as illustratively shown.

As also shown in the illustrated examples, in the case of a differential output there will be a certain common mode voltage $V_{cm}$, while in the case of single ended output there will be an average voltage $V_{avg}$, both corresponding to the average output voltage following a long sequence of alternated zeroes and ones (FIG. 2A). The switching threshold of the input stage G of the digital circuitry (FIGS. 1A and 1B) will be fixed to a value to correspond to the average value $V_{avg}$ or to the common mode value $V_{cm}$. Therefore, a fundamental prerequisite of the input circuit is that the output signal be centered with respect to these values ($V_{avg}$ or $V_{cm}$), as the threshold of discrimination of the input digital value is fixed as a function thereof.

In this way, the level of the output signal may be shifted with respect to the level of the input signal without loosing data because the output signal is kept centered independently from the succession of values of the input signal, as shown in the examples of FIG. 2B and at (a) in FIG. 3. If, because of the characteristics of the input circuit, the output signal is not kept centered with respect to its average value or its common mode value, as shown at (c) in FIG. 3, it may happen that a digital value 1 is erroneously read as a zero by the digital circuit connected in cascade to the input circuit (or vice-versa). This may happen because the signal may remain below (or above) the switching threshold if a sufficiently long sequence of zeroes (or ones) determines a shift of the working point of the output node. This shift is either toward ground in the case of a long sequence of zeroes, as shown at (c) in FIG. 3, or toward the supply voltage in the case of a long sequence of ones.

A known prior art design approach for the input circuit is illustrated in FIG. 4 which utilizes two operational amplifiers (op-amps), one of which has a common mode compatibility toward the supply voltage ($V_{dd}$) and the other toward ground (GND). The voltage outputs are both single ended and connected in common to provide for a single ended output of the entire circuit.

The design illustrated in FIG. 4 has certain drawbacks. First, the output is single ended and is obtained by short circuiting the outputs of the two distinct operational amplifiers, which may conflict with each other. This may slow down the system because the circuit has to work even when the two parts are in conflict. This happens because of an unbalanced common mode, either toward the supply voltage ($V_{dd}$) or toward ground (GND), which causes one of the two pairs of input transistors of the two distinct operational amplifiers to start turning off.

Furthermore, the output node $V_{out}$ is a high impedance node having a high gain and, as a result, is relatively slow. The high impedance implies that in the presence of certain input sequences there is a likelihood of losing data in the case illustrated at (c) in FIG. 3. In fact, in an integrated circuit a high impedance output node has a parasitic series capacitance toward the substrate creating a pole at a low frequency. This practically integrates the output signal and centers it on a short-term average value, producing the result shown at (c) in FIG. 3.

Yet another drawback of the above-described prior art design is that two reference voltages are needed, namely $V_{BP2}$ and $V_{BN2}$. The generation of these voltages may require further silicon area for implementation.

SUMMARY OF THE INVENTION

It is therefore an object of the invention to provide an analog input circuit which provides full input common mode compatibility toward supplies rails and provides for a low impedance output, thus reducing the risk of losing data, and with a circuit configuration that is relatively simple and integrable in a reduced silicon area with respect to prior art circuits.

In accordance with the invention, an analog input circuit may include a pair of differential transconductance input stages having input nodes connected in parallel and which are fed the analog input signal. One of the differential transconductance stages may have common mode compatibility toward the supply node at the highest potential, and the other stage may have common mode compatibility toward the supply node at the lowest potential. Furthermore, differential output currents of the transconductance input stages may be summed differentially on first and second input nodes of a differential converter stage, which converts the differential current signals to an amplified differential voltage output signal.

The analog input circuit in accordance with the invention has a relatively low output impedance which provides high speed, as well as enhanced stability of the working point of the circuit.

BRIEF DESCRIPTION OF THE DRAWINGS

The present invention and the particular features and advantages thereof will be further understood with reference to the following detailed description of an embodiment thereof and with reference to the attached drawings, in which.

DETAILED DESCRIPTION OF THE PREFERRED EMBODIMENTS

Figure 1A:
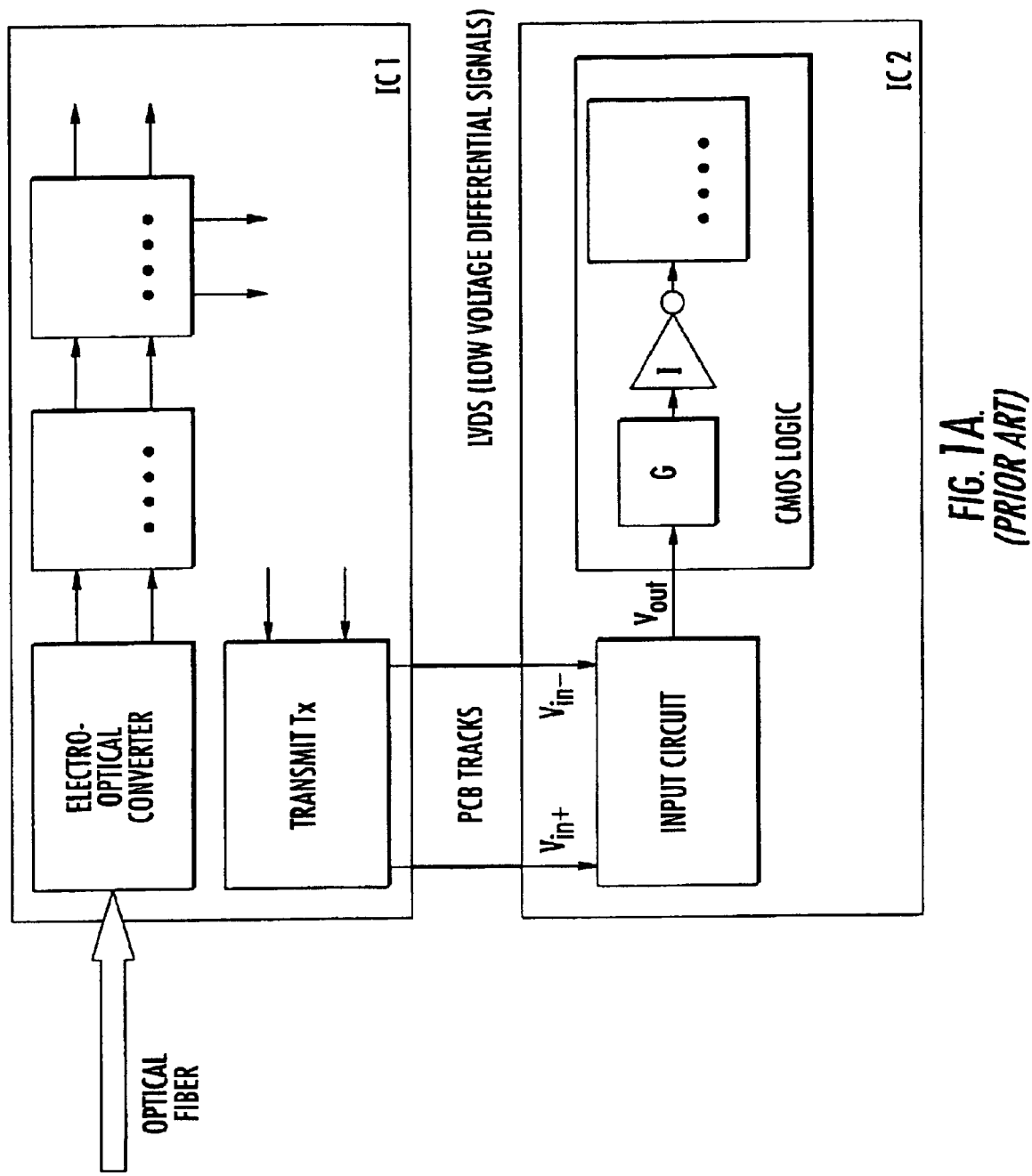
FIGS. 1A and 1B are schematic block diagrams of printed circuit boards including analog input circuits in accordance with the prior art.
Figure 1B:
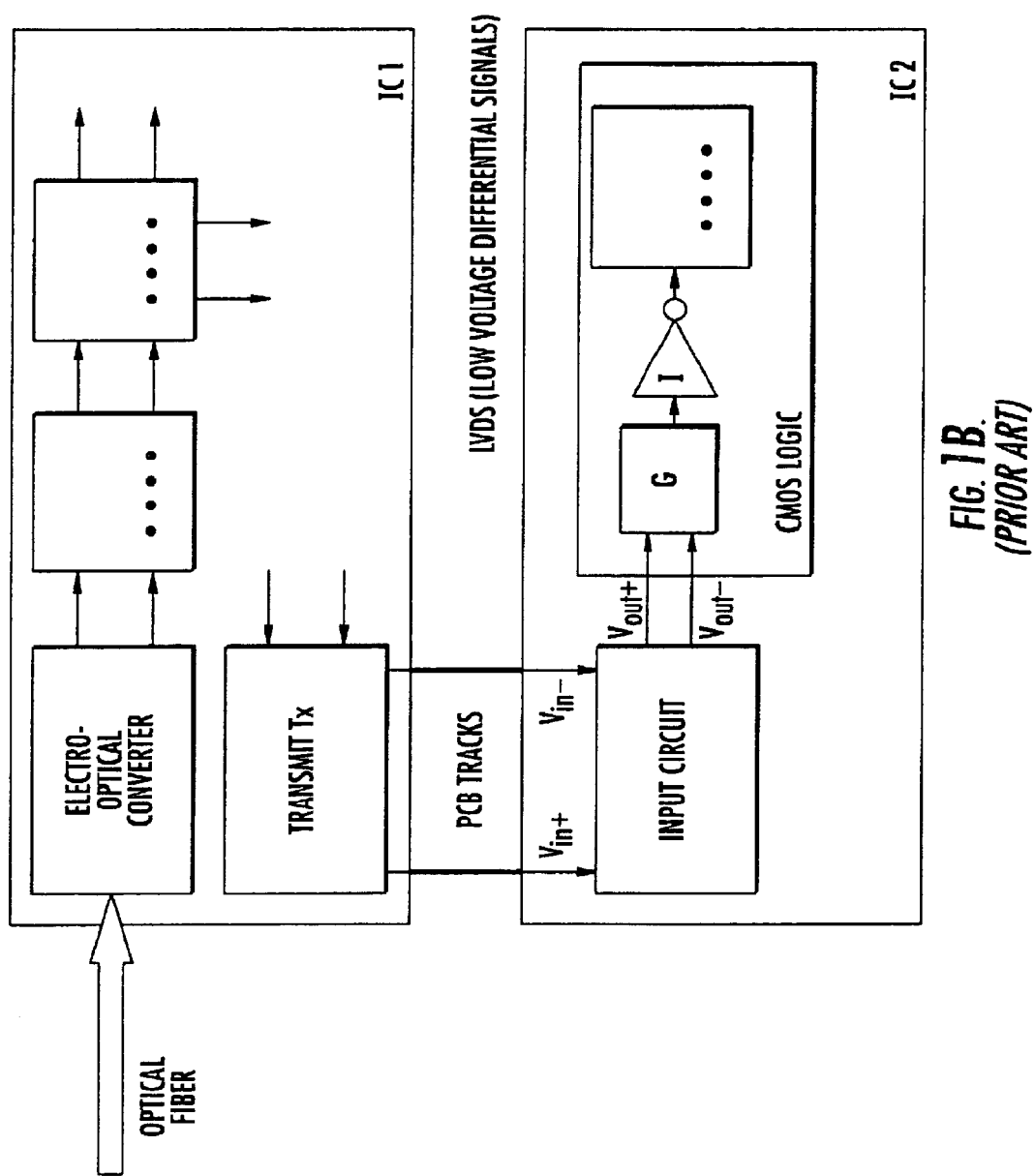
Figure 2A:
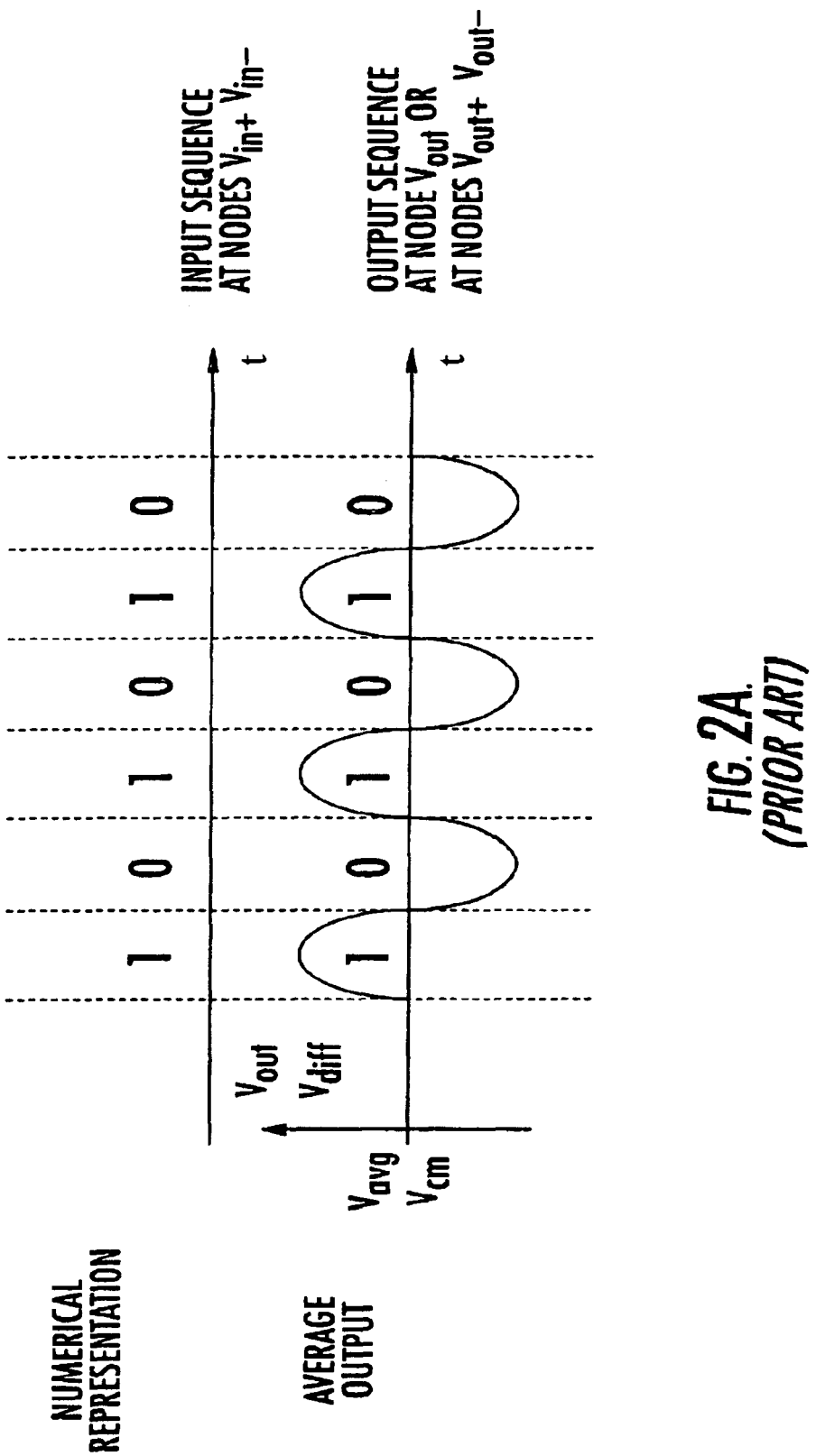
FIGS. 2A, 2B, and 3 are signal diagrams illustrating certain operating conditions of the analog input circuits of FIGS. 1A and 1B.
Figure 2B:
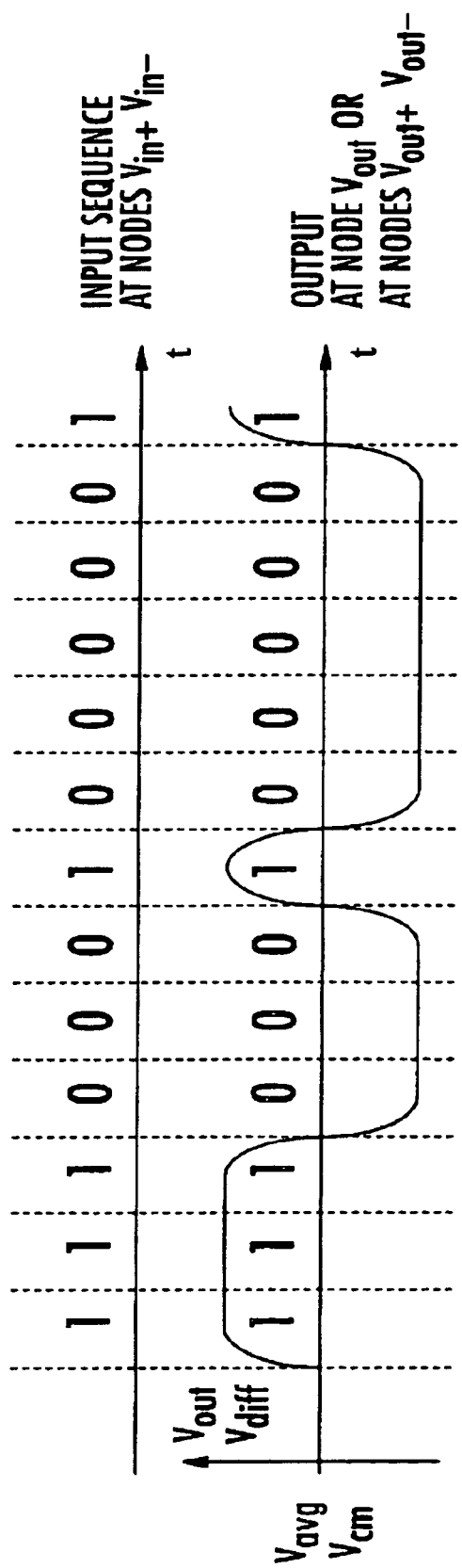
Figure 3:
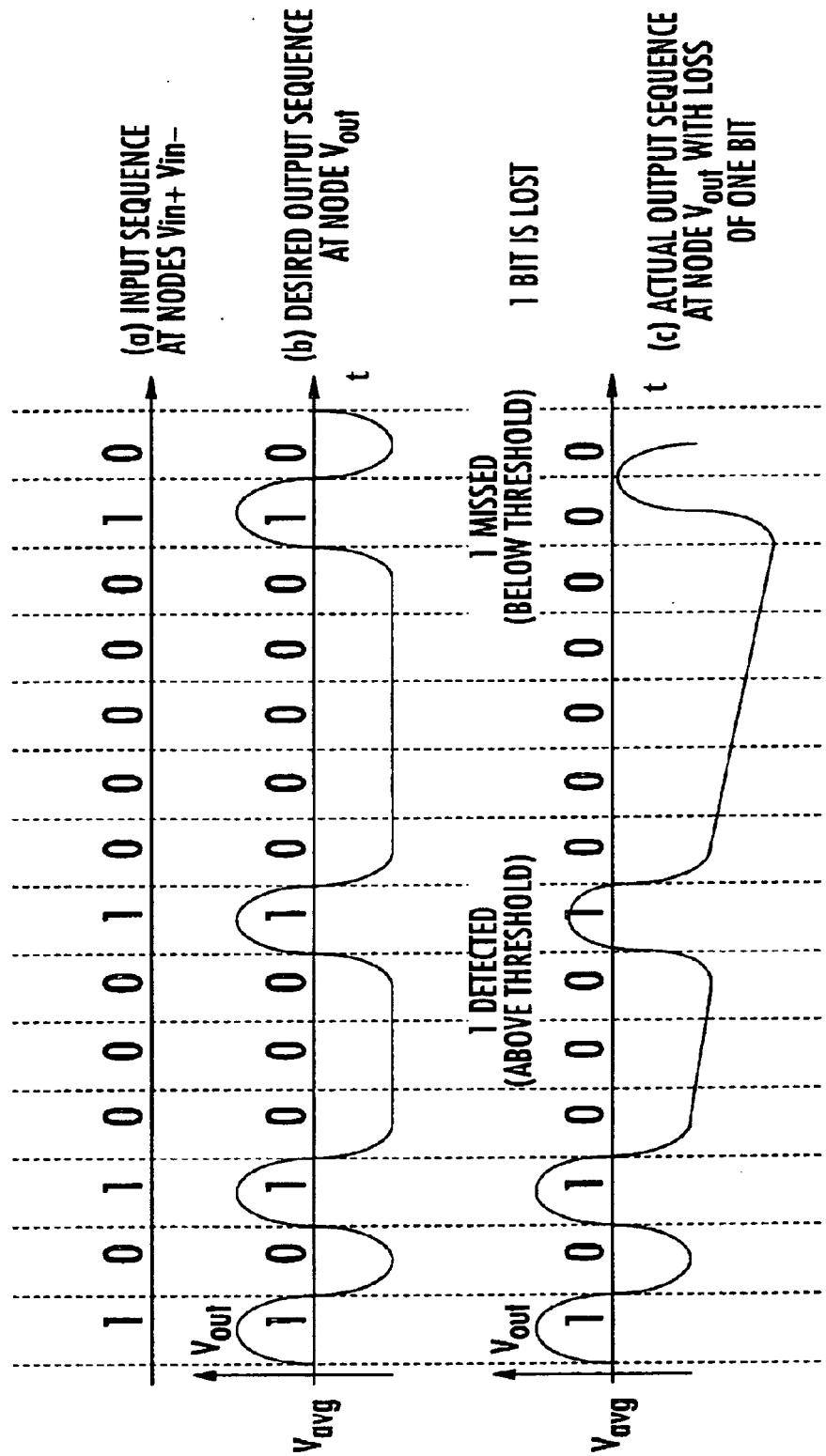
Figure 4:
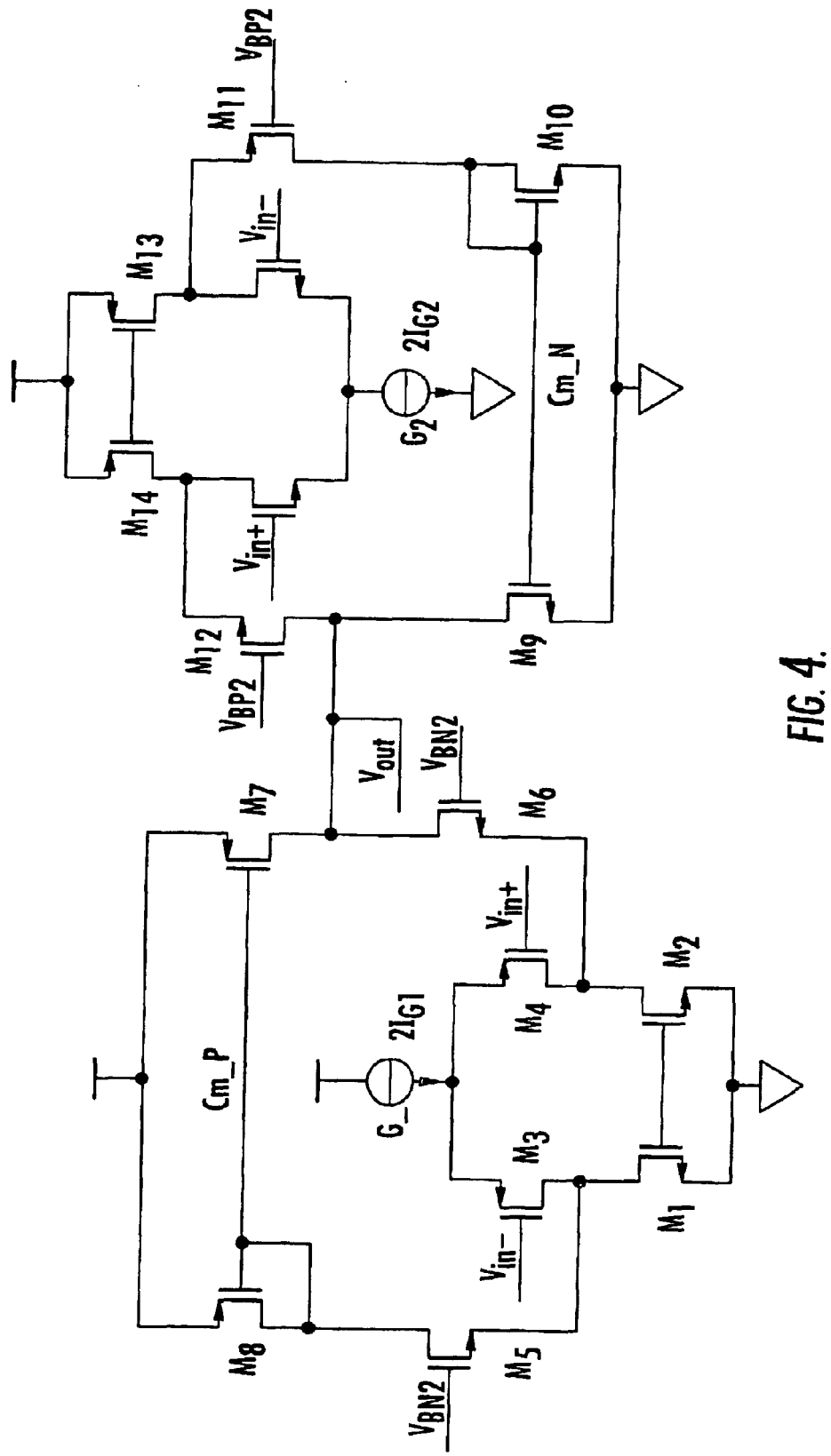
FIG. 4 is a schematic circuit diagram of a prior art analog input circuit including two operational amplifiers connected in parallel.
Figure 5:
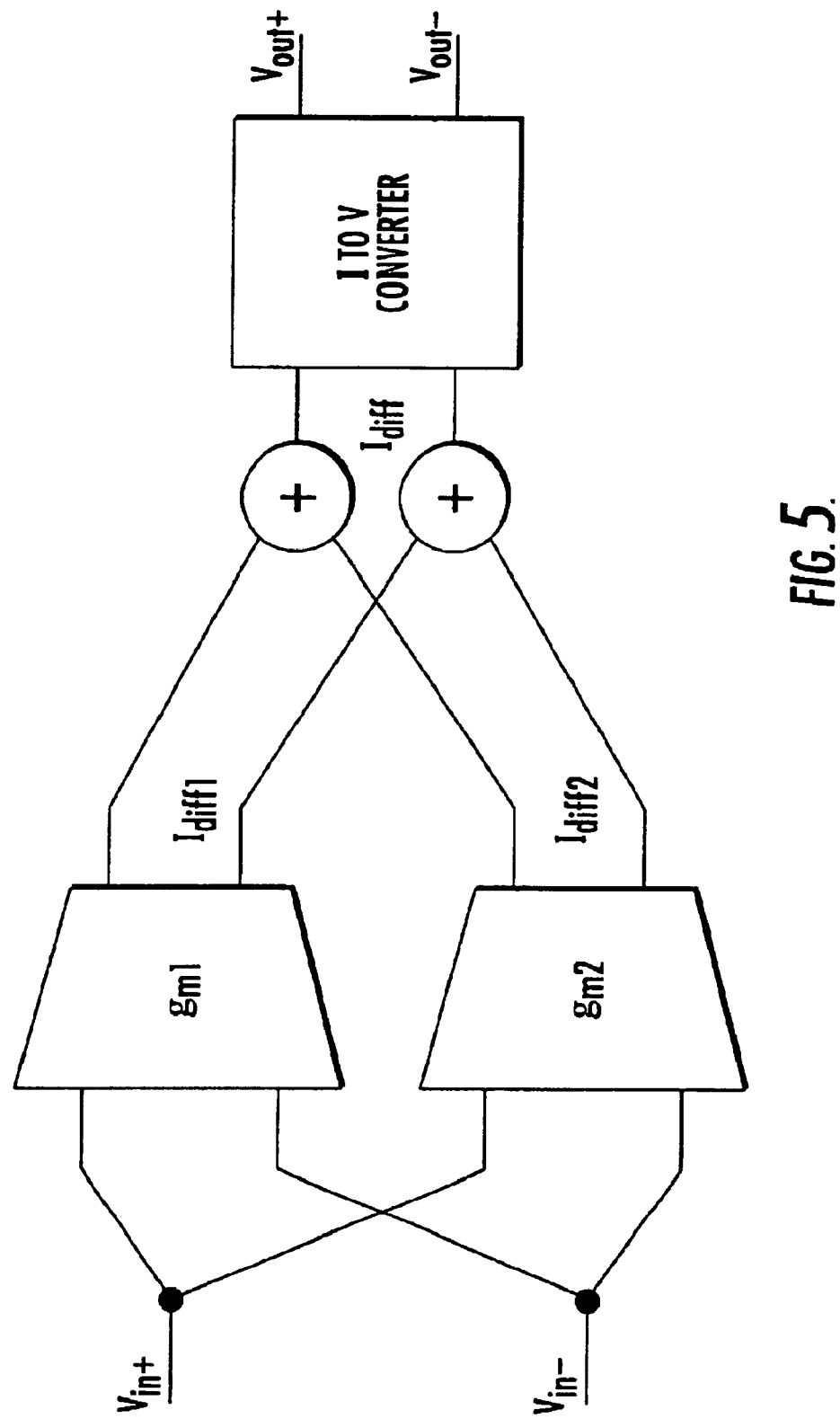
FIG. 5 is a schematic block diagram of an analog input circuit in accordance with the present invention.

Referring now to FIG. 5, the analog input circuit of the present invention is, generally speaking, based on the use of two transconductance differential input stages $g_{m1}$ and $g_{m2}$ whose inputs are connected in parallel. The differential stage $g_{m1}$ is compatible toward the supply voltage, and the differential stage $g_{m2}$ is compatible toward ground. The differential output currents $I_{diff1}$ and $I_{diff2}$ are summed, in differential mode, and the resulting differential current signal $I_{diff}$ is converted to a differential voltage signal on the output nodes of the circuit, $V_{out+}$ and $V_{out-}$. The circuit illustrated in FIG. 5 may be implemented by using two operational amplifiers OA1 and OA2, in which one of the operational amplifiers includes an output I to V converting stage, as illustrated with a dashed box in FIG. 6.

Figure 6:
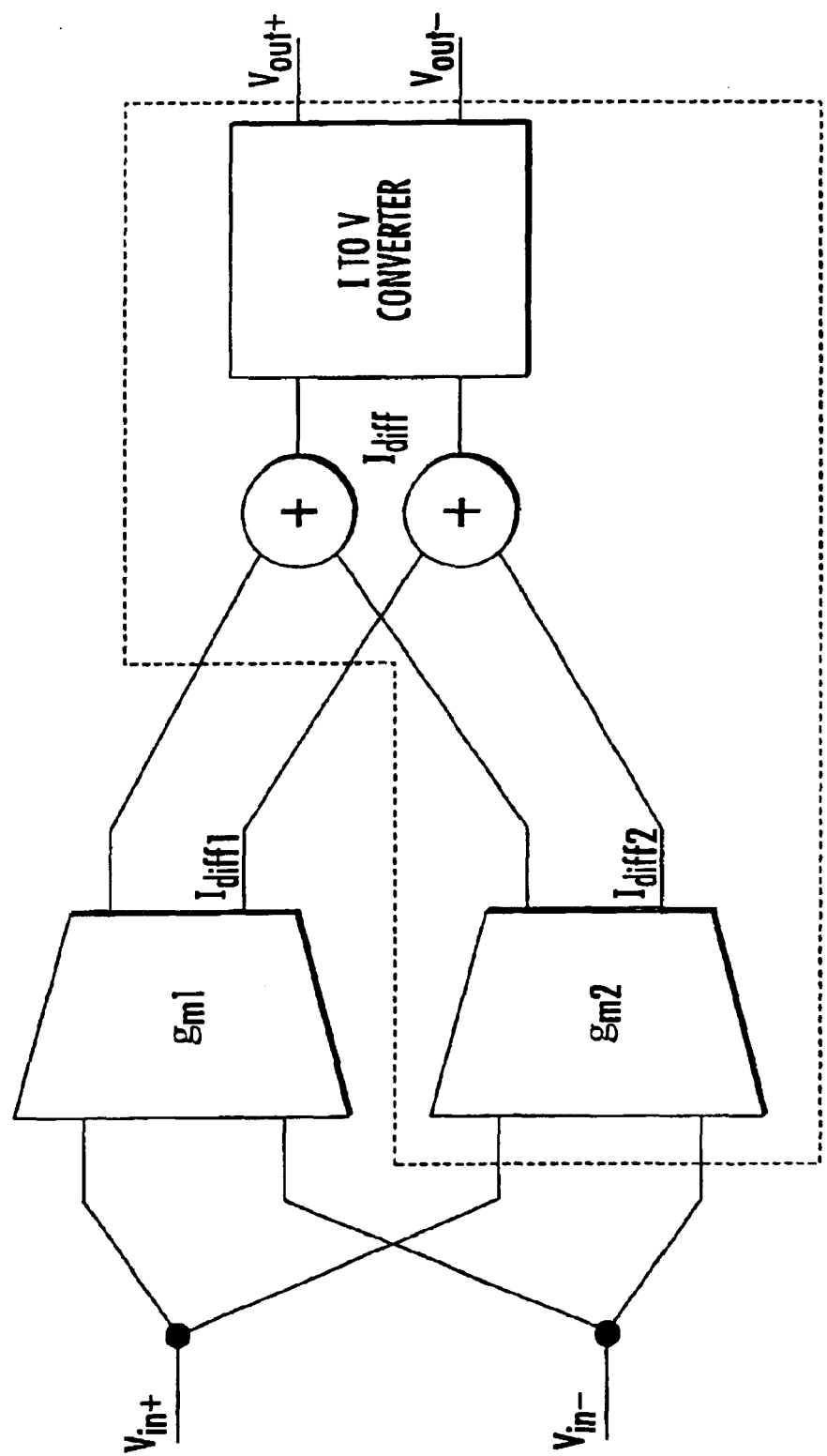
FIG. 6 is a schematic block diagram of an alternate embodiment of the analog input circuit of FIG. 5.
Figure 7:
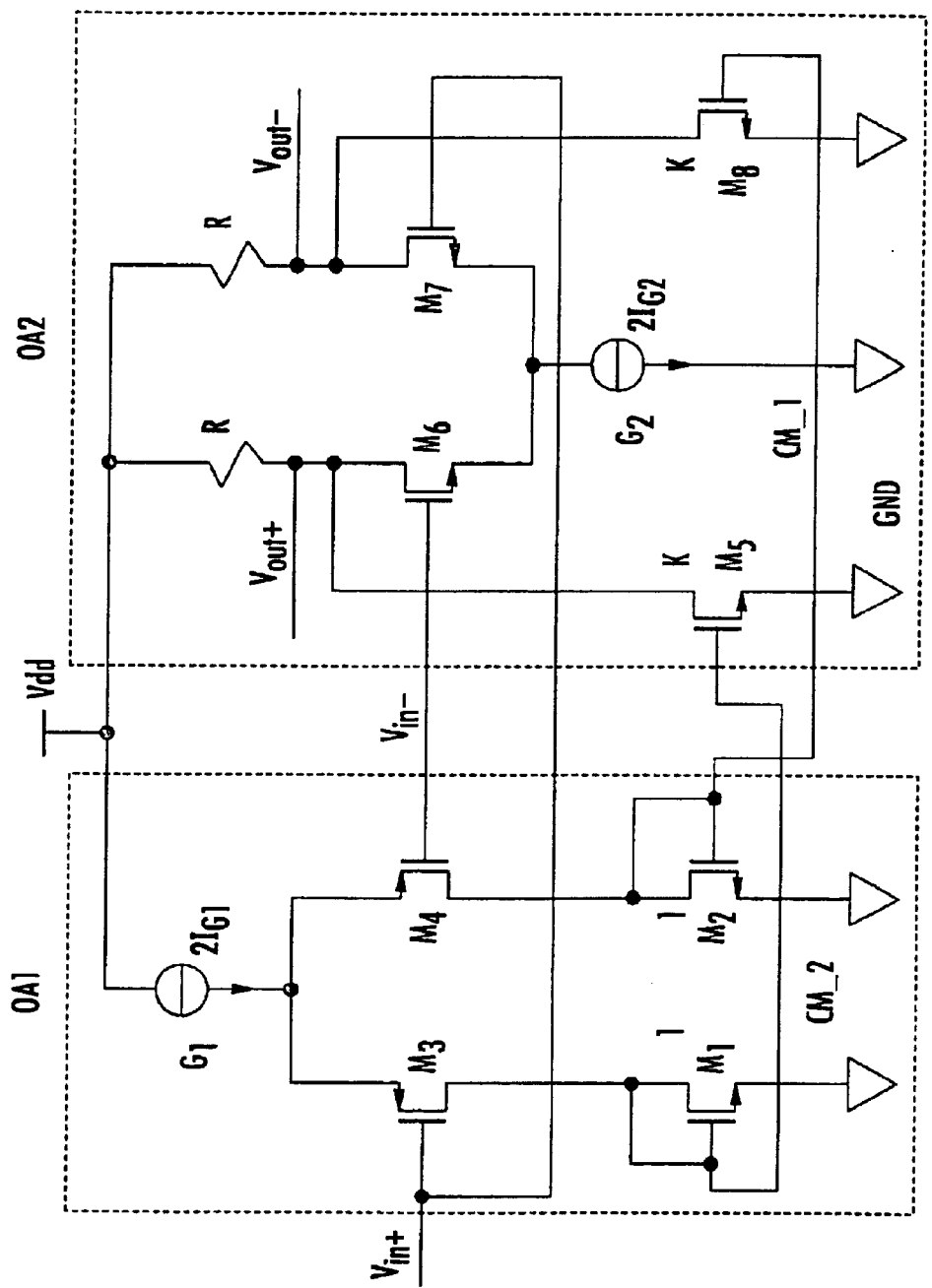
FIG. 7 is a schematic circuit diagram illustrating in greater detail the analog input circuit of FIG. 6.

Referring more particularly to FIG. 7, an exemplary circuit implementation of the circuit of FIG. 6 is illustrated in which the operational amplifiers OA1 and OA2 are connected in parallel. As will be described further below, the operational amplifier OA1 is compatible toward ground potential GND if the process of fabrication of the integrated circuit produces turn on threshold voltages for the P-channel and N-channel transistors of the differential input pair $M_3$ and $M_4$ such that $V_{thN} < V_{thP}$. Similarly, OA2 is compatible toward the supply voltage $V_{dd}$ because of a proper sizing of the components thereof, as will also be discussed below.

Figure 8:
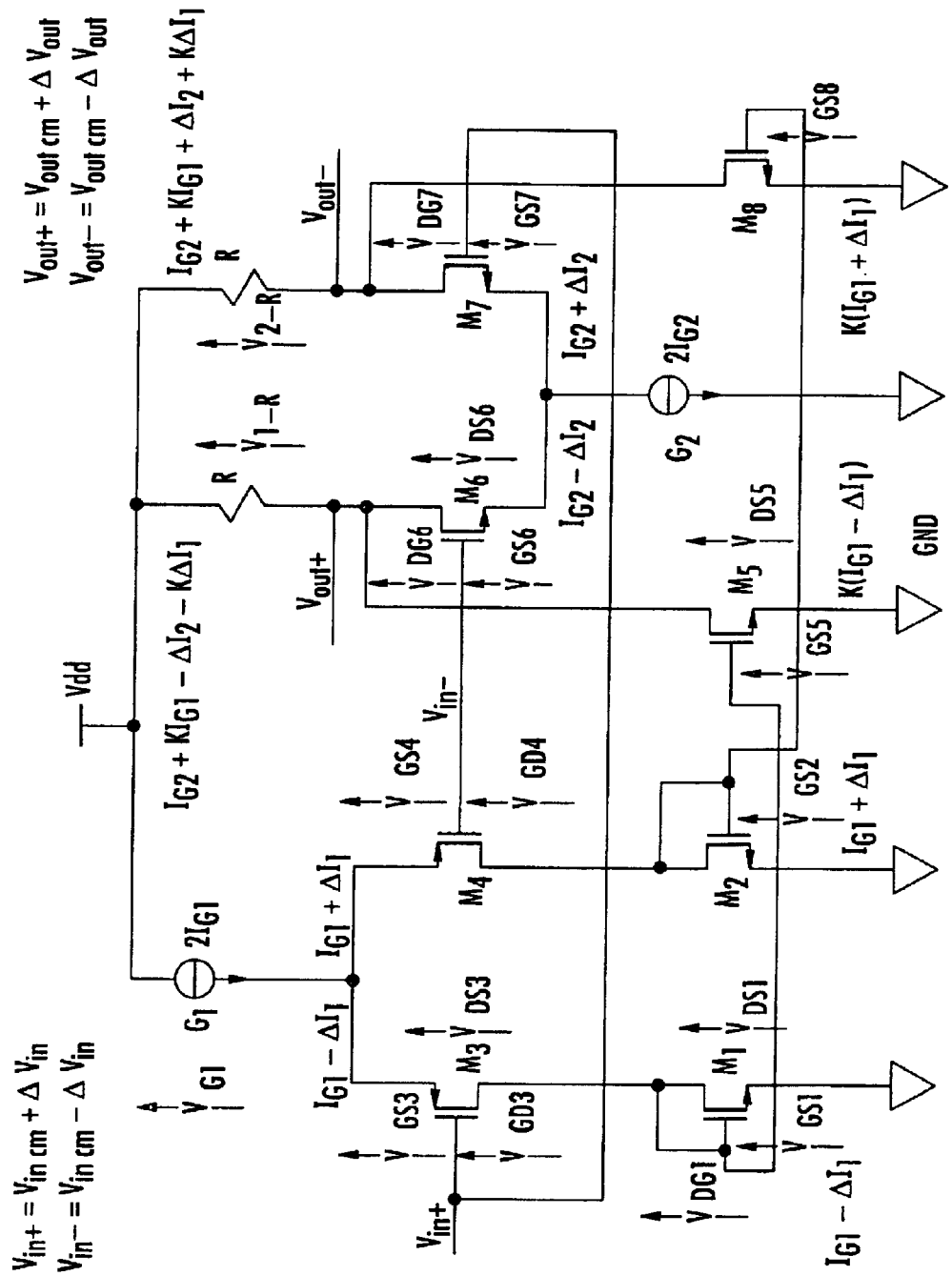
FIG. 8 is a schematic circuit diagram of the analog input circuit of FIG. 7 with relevant signal analysis reference data.
Figure 9:
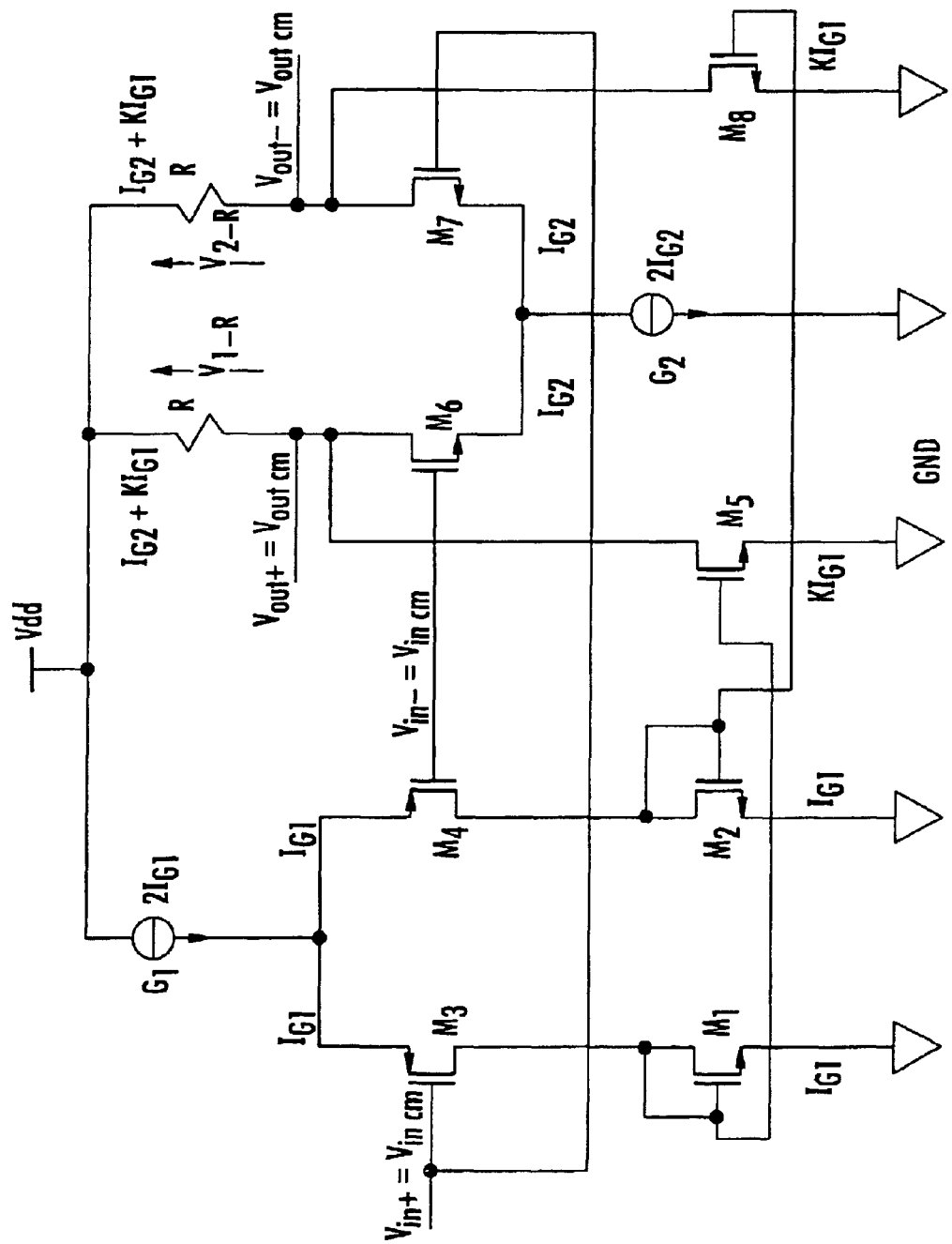
FIG. 9 is a schematic circuit diagram of the analog input circuit of FIG. 7 with common mode analysis reference data.
Figure 10:
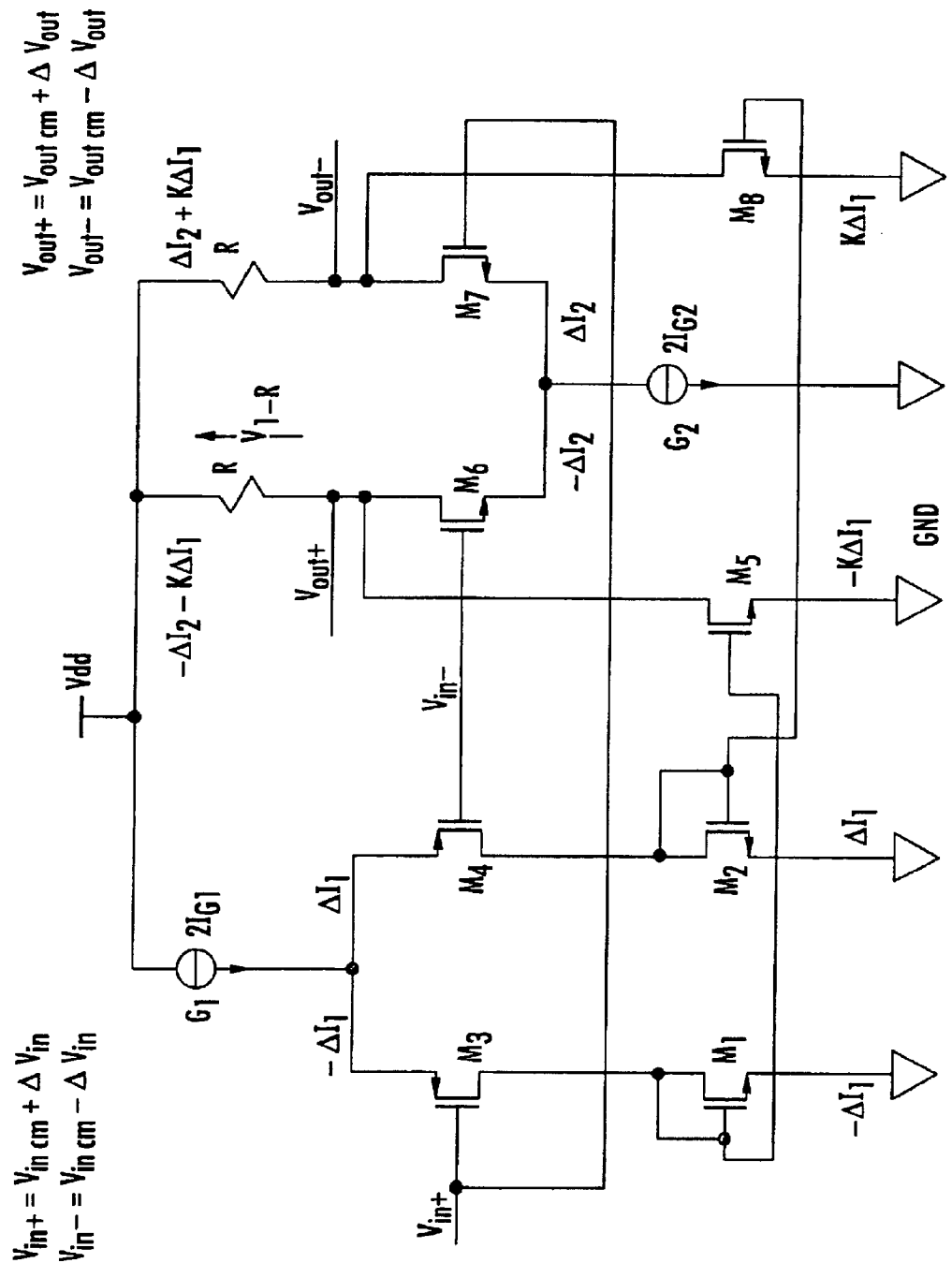
FIG. 10 is a schematic block diagram of the analog input circuit of FIG. 7 with differential mode analysis reference data.

The functioning of the circuit will be further understood with reference to FIGS. 8, 9 and 10, which show data and parameters relative to the differential input circuit, the common mode analysis, and the differential mode analysis, respectively. The voltage of the differential input signal, $$V_{in+} - V_{in-} = 2\Delta V_{in},$$

is applied in parallel to the inputs of the two operational amplifiers OA1 and OA2. In the operational amplifier OA1, the resulting differential currents $\Delta I_1$ and $-\Delta I_1$ are output by two current mirrors, CM_1 and CM_2, respectively, with a certain mirror ratio K. The differential output voltage, $$V_{out+} - V_{out-} = 2\Delta V_{out},$$

is given by:

$$V_{2-R} - V_{1-R} = 2R(K\Delta I_1 + \Delta I_2).$$

With particular reference to FIG. 9, the output common mode voltage is given by:

$$V_{out\ cm} = V_{dd} - R(I_{G2} + K\ I_{G1}),$$

and may be predetermined by choosing R, K, $I_{G1}$ and $I_{G2}$.

The common mode compatibility toward ground as well as toward the supply voltage will now be further described. Starting the analysis from the operational amplifier OA1 (FIG. 8), the gate-source voltage of the MOS transistor $M_1$ (and similarly of M2) is given by:

$$V_{GS1} = V_{thN} + V_{od1},$$

where the threshold voltage for an N channel MOS is defined as $V_{thN} > 0$, and $V_{od1}$ is the overdrive voltage of $M_1$ which produces, for the chosen aspect ratio $W_1/L_1$, the current $I_{G1}$ when $M_1$ saturates.

For saturation, it is necessary that $V_{DS1}$ be such that:

$$V_{GS1} - V_{thN} = V_{od1}(I_{G1}) \leq V_{DS1} \text{ (with } V_{DS1} > 0\text{), and}$$

$$-V_{thN} \leq V_{DS1} - V_{GS1};$$

i.e., if:

$$-V_{thN} \leq V_{DG1}.$$

Of course, the diode connection of $M_1$ ensures that such a condition be verified. The value of the overdrive voltage $V_{od1}$ is given by the well known relation:

$$I_D = K(W/L)(V_{GS} - V_{th})^2 = K(W/L)V_{od}^2,$$

that correlates the overdrive voltage to the current delivered (for PMOS and NMOS transistors). The sum of the (common mode) voltages on $M_3$ and $M_1$ is given by:

$$V_{G1}+V_{DS3}+V_{DS1}=V_{dd};$$

$$V_{G1}+V_{GS3}+V_{GD3}+(V_{thN}+V_{od1})=V_{dd}; \text{ and}$$

$$V_{G1}+(V_{thP}+V_{od3})+V_{GD3}+(V_{thN}+V_{od1})=V_{dd},$$

where $V_{thP}$ and $V_{od3}$ are the threshold and the overdrive voltages of the MOS transistor $M_3$, for which the same considerations made for the transistor $M_1$ hold. The threshold voltage for a PMOS transistor is defined as $V_{thP}<0$, and also $V_{od3}$ is negative.

The conditions under which the operational amplifier OA1 is compatible toward ground potential GND will now be discussed, starting from a saturated working condition. To this end, let us suppose that the input common mode voltage $V_{in\ cm}$ decreases (FIGS. 8 and 9). The current $I_{G1}$ remains constant, thus the voltages $V_{GS1}$ and $V_{GS3}$ remain constant while the voltages $V_{DS3}$ and $V_{GD3}$ decrease and the voltage $V_{G1}$ increases. This may continue as long as $M_3$ and $M_1$ reach saturation, that is as long as $V_{GD3} \geq V_{thP}$ (i.e., considering the negative sign of $V_{thP}$, $|V_{GD3}| \leq |V_{thP}|$, $V_{GD3}$ being negative) and consequently $V_{DS3} \geq -V_{od3}$ (that is $V_{DS3} \geq |V_{od3}|$).

Should it happen that, while $V_{in\ cm}$ continues to decrease, the voltage $V_{GD3}$ diminishes below the negative value of the threshold voltage $V_{thP}$, then $M_3$ would exit from saturation and enter in the linear zone of its characteristics. The current $I_{G1}$ remains constant, but the voltage $V_{GS3}$ increases, the voltage $V_{GD3}$ diminishes below $V_{thP}$ (i.e., $V_{GD3} < -|V_{thP}|$ and is positive), and the sum voltage $V_{DS3}$ diminishes, but less rapidly than when the transistor $M_3$ was saturated. In other words, for a current $I_{D3}=I_{G1}=$a constant, the working point shifts along characteristic curves corresponding to increasing values of $V_{GS}$. The voltage $V_{G1}$ increases, but by a small amount.

The transistor $M_1$ continues to work in the saturation region. Obviously this behavior is undesirable in this case because an amplifier operates correctly only if both MOS transistors $M_3$ and $M_4$ are saturated. The limit condition for saturating $M_3$ and $M_4$, considering the limit of the saturating condition (for which $V_{GD3}=V_{thP}$), is:

$$V_{in\ cm}=V_{GD3}+V_{DS1}=V_{thP}+V_{thN}+V_{od1} \leq 0.$$

Thus, for compatibility of the common mode with respect to the ground potential ($V_{in\ cm}=0$), it is desired that the following condition be verified:

$$V_{thP}+V_{thN}+V_{od1} \leq 0, \text{ and}$$

$$|V_{thP}| \geq V_{thN}+V_{od1},$$

(because $V_{thP}$ has been defined to be negative).

By contrast, the operational amplifier OA1 is not compatible with respect to the supply voltage $V_{dd}$. In fact, $V_{in\ cm}$ may increase only as far as the voltage on the current generator $G_1$ will permit its functioning as a current generator. Beyond that, $I_{G1}$ starts decreasing and the amplifier progressively turns off, while the MOS transistors $M_3$ and $M_1$ continue to be in saturation, but with gradually decreasing currents.

This may be observed by considering that the generator $G_1$ is made by P-channel MOS transistors, for which the same considerations made above hold. That is, the condition $V_{G1} \geq |V_{odG1}|$ should be verified for the MOS transistors to operate in the saturation region. When $V_{G1}$ diminishes the overdrive voltage diminishes, and as a consequence the delivered current also diminishes until the MOS transistors turn off. It is worth noting that the turn off is not abrupt but gradual. This represents a particular advantage in many applications. Of course, similar considerations are valid also for the transistors $M_4$ and $M_2$.

Compatibility with respect to the supply voltage is provided by the second operational amplifier OA2. Similar to what has been discussed with reference to the operation amplifier OA1, the voltage $V_{DG6}$ may become negative, but the absolute value thereof should not surpass $V_{thN}$, thus it is necessary that:

$$V_{thN} \geq R \cdot (I_{G2}+K \cdot I_{G1}).$$

If this relation is verified, the transistor $M_6$ correctly operates in the saturation region even when $V_{out\ cm}=V_{dd}$, otherwise it would operate in the linear functioning region. Similar considerations are also valid for the transistor $M_7$.

Summarizing the above considerations, compatibility toward the supply voltage is provided by OA2 by virtue of an adequate sizing of the MOS transistors and of resistors R. Compatibility toward ground potential, ensured by OA1, requires that the overdrive voltage of the N-channel CMOS transistors that form the mirrors CM_1 and CM_2 be sufficiently small, and it is desirable that $|V_{thP}|$ be greater than $V_{thN}$.

Among the numerous advantages of the analog input circuit of this invention, it is particularly worth noting that this circuit has a relatively simple design, is easily realized without other ancillary circuitry, it has low output impedance, and it requires relatively less area for integration.

That which is claimed is:

1. An input circuit for receiving an input differential analog signal without a constant common mode and outputting a differential signal having a constant common mode and comprising:
   first and second supply nodes, said first supply node being at a higher potential than said second supply node;
   first and second differential transconductance input stages receiving the input differential analog input signal and outputting respective differential currents, said first input stage having common mode compatibility with respect to said second supply node, and said second input stage having common mode compatibility with respect to said first supply node; and
   a differential current-to-voltage converting stage for differentially summing respective differential currents output by said input stages and converting the summed currents into the output differential signal.

2. The input circuit of claim 1 wherein said first input stage comprises a first Operational amplifier with common mode compatibility with respect to the lower potential at the second supply node; and wherein second input stage comprises a second operational amplifier with common mode compatibility with respect to the higher potential at the first supply node.

3. The input circuit of claim 2 wherein said first and second operational amplifiers each comprises a respective pair of input metal oxide semiconductor (MOS) transistors connected to the higher potential, and a respective current mirror connected to each of said input MOS transistors and to the lower potential, each current mirror comprising a pair of MOS transistors.

4. The input circuit of claim 3 wherein said input transistors of said first operational amplifier comprise P-channel MOS transistors; wherein said input transistors of said second operational amplifier comprise N-channel MOS transistors.

5. The input circuit of claim 4 wherein a turn-on threshold $V_{thP}$ of said P-channel input MOS transistors and a turn-on threshold $V_{thN}$ of said N-channel input MOS transistors satisfy the relationship $|V_{thP}| \geq V_{thN} + V_{od1}$, where $V_{od1}$ is an overdrive voltage of said MOS transistors of said current mirrors.

6. The input circuit of claim 4 wherein said second operational amplifier further comprises a respective resistor connecting each of said input MOS transistors to the higher potential; and wherein a value R of said resistors is such that $V_{thN} \geq R \cdot (I_{G2} + K \cdot I_{G1})$, where $V_{thN}$ is a turn-on voltage of said N-channel MOS transistors, $I_{G1}$ and $I_{G2}$ are biasing currents of said first and second operational amplifiers, respectively, and K is a mirror ratio of said current mirrors.

7. The input circuit of claim 1 wherein said first and second input stages have parallel signal paths.

8. The input circuit of claim 1 wherein the output differential signal is amplified with respect to the input differential analog signal.

9. An input circuit comprising:

first and second supply nodes, said first supply node being at a higher potential than said second supply node;

first and second differential transconductance input stages having parallel signal paths and each receiving the differential analog input signal and outputting respective differential currents;

said first input stage comprising a first operational amplifier with common mode compatibility with respect to the lower potential at the second supply node;

said second input stage comprising a second operational amplifier with common mode compatibility with respect to the higher potential at the first supply node; and a differential current-to-voltage converting stage for differentially summing respective differential currents output by said input stages and converting the summed currents into an output differential signal.

10. The input circuit of claim 9 wherein said first and second operational amplifiers each comprises a respective pair of input metal oxide semiconductor (MOS) transistors connected to the higher potential, and a respective current mirror connected to each of said input MOS transistors and to the lower potential, each current mirror comprising a pair of MOS transistors.

11. The input circuit of claim 9 wherein said input transistors of said first operational amplifier comprise P-channel MOS transistors; wherein said input transistors of said second operational amplifier comprise N-channel MOS transistors.

12. The input circuit of claim 11 wherein a turn-on threshold $V_{thP}$ of said P-channel input MOS transistors and a turn-on threshold $V_{thN}$ of said N-channel input MOS transistors satisfy the relationship $|V_{thP}| \geq V_{thN} + V_{od1}$, where $V_{od1}$ is an overdrive voltage of said MOS transistors of said current mirrors.

13. The input circuit of claim 11 wherein said second operational amplifier further comprises a respective resistor connecting each of said input MOS transistors to the higher potential; and wherein a value R of said resistors is such that $V_{thN} \geq R \cdot (I_{G2} + K \cdot I_{G1})$, where $V_{thN}$ is a turn-on voltage of said N-channel MOS transistors, $I_{G1}$ and $I_{G2}$ are biasing currents of said first and second operational amplifiers, respectively, and K is a mirror ratio of said current mirrors.

14. The input circuit of claim 9 wherein the output differential signal is amplified with respect to the input differential analog signal.

15. A method for converting an input differential analog signal without a constant common mode to a differential signal having a constant common mode and comprising:

connecting the input differential analog signal, to each of a pair of differential transconductance input stages and outputting respective differential currents from each input stage, the second input stage having common mode compatibility with respect to a first supply node, and the first input stage having common mode compatibility with respect to a second supply node, the first supply node being at a higher potential than the second supply node;

differentially summing the respective differential currents output by the input stages; and converting the summed currents into the differential signal having the constant common mode.

16. The method of claim 15 wherein the first input stage comprises a first operational amplifier with common mode compatibility with respect to the lower potential at the second supply node; and wherein the second input stage comprises a second operational amplifier with common mode compatibility with respect to the higher potential at the first supply node.

17. The method of claim 16 wherein the first and second operational amplifiers each comprises a respective pair of input metal oxide semiconductor (MOS) transistors connected to the higher potential, and a respective current mirror connected to each of the input MOS transistors and to the lower potential, each current mirror comprising a pair of MOS transistors.

18. The method of claim 17 wherein the input transistors of the first operational amplifier comprise P-channel MOS transistors; wherein the input transistors of the second operational amplifier comprise N-channel MOS transistors.

19. The method of claim 18 wherein a turn-on threshold $V_{thP}$ of the P-channel input MOS transistors and a turn-on threshold $V_{thN}$ of the N-channel input MOS transistors satisfy the relationship $|V_{thP}| \geq V_{thN} + V_{od1}$, where $V_{od1}$ is an overdrive voltage of the MOS transistors of the current mirrors.

20. The method of claim 18 wherein the second operational amplifier further comprises a respective resistor connecting each of the input MOS transistors to the higher potential; and wherein a value R of the resistors is such that $V_{thN} \geq R \cdot (I_{G2} + K \cdot I_{G1})$, where $V_{thN}$ is a turn-on voltage of the N-channel MOS transistors, $I_{G1}$ and $I_{G2}$ are biasing currents of the first and second operational amplifiers, respectively, and K is a mirror ratio of the current mirrors.

21. The method of claim 16 wherein the first and second input stages have parallel signal paths.

* * * * *